(12) United States Patent
Beer et al.

(10) Patent No.: US 12,521,846 B2
(45) Date of Patent: Jan. 13, 2026

(54) FRAME FOR DISPLAY ASSEMBLY

(71) Applicant: Snap-on Incorporated, Kenosha, WI (US)

(72) Inventors: Joshua M. Beer, Kenosha, WI (US); Jason Genz, Kenosha, WI (US)

(73) Assignee: Snap-on Incorporated

( * ) Notice: Subject to any disclaimer, the term of this patent is extended or adjusted under 35 U.S.C. 154(b) by 1233 days.

(21) Appl. No.: 17/143,565

(22) Filed: Jan. 7, 2021

(65) Prior Publication Data

US 2022/0212332 A1    Jul. 7, 2022

(51) Int. Cl.
*B25B 21/00* (2006.01)
*B25F 5/02* (2006.01)
*H05K 5/02* (2006.01)
*B25B 23/147* (2006.01)

(52) U.S. Cl.
CPC .............. *B25B 21/004* (2013.01); *B25F 5/02* (2013.01); *H05K 5/0217* (2013.01); *H05K 5/0247* (2013.01); *B25B 23/147* (2013.01)

(58) Field of Classification Search
CPC ......... B25F 5/02; B25B 21/004; B25B 23/14; B25B 23/142; B25B 23/147; B25B 23/16; B25B 23/1422; B25B 23/1427; B25B 23/1475; B25B 23/1405; B25B 23/0007; H05K 5/0017; H05K 5/0217; H05K 5/0247

See application file for complete search history.

(56) References Cited

U.S. PATENT DOCUMENTS

| | | | |
|---|---|---|---|
| 4,357,061 A | 11/1982 | Crosby |
| 4,789,774 A | 12/1988 | Koch et al. |
| 5,339,178 A | 8/1994 | Phelps, III et al. |
| 5,442,470 A | 8/1995 | Hashimoto |
| 5,729,250 A | 3/1998 | Bishop et al. |
| 5,923,319 A | 7/1999 | Bishop et al. |
| 6,292,239 B1 | 9/2001 | Nagamura et al. |
| 6,463,811 B1 | 10/2002 | Putney |
| 6,667,936 B1 | 12/2003 | Ditzig |
| 7,130,185 B2 | 10/2006 | Chen et al. |
| 7,382,692 B1 | 6/2008 | Hildebrandt |

(Continued)

FOREIGN PATENT DOCUMENTS

| | | |
|---|---|---|
| CN | 201522942 U | 7/2010 |
| CN | 201837490 U | 5/2011 |

(Continued)

OTHER PUBLICATIONS

Taiwan Office Action for corresponding Application No. 11121043910 dated Oct. 26, 2022, 7 pages.

(Continued)

*Primary Examiner* — Robert J Scruggs
(74) *Attorney, Agent, or Firm* — Taft, Stettinius & Hollister LLP

(57) ABSTRACT

A display assembly for a tool having a housing. The display assembly has a display unit, a frame, a display housing, and buttons. The display housing has a protrusion that is received by an aperture of the frame adapted to receive the protrusion to couple the frame to the display housing. The display unit is disposed between the display housing and the frame. The buttons are disposed on the display housing.

18 Claims, 6 Drawing Sheets

(56) References Cited

U.S. PATENT DOCUMENTS

| | | | |
|---|---|---|---|
| 7,562,589 B2* | 7/2009 | Anjanappa | B25B 23/1425 |
| | | | 81/479 |
| 7,920,223 B2 | 4/2011 | Nishizawa et al. | |
| 7,936,414 B2 | 5/2011 | Hsiao et al. | |
| 8,081,269 B2 | 12/2011 | Yada et al. | |
| 8,139,177 B2* | 3/2012 | Nishizawa | G02F 1/133305 |
| | | | 349/60 |
| 8,164,705 B2 | 4/2012 | Hsiao et al. | |
| 8,462,289 B2 | 6/2013 | Nishizawa et al. | |
| 8,736,783 B2 | 5/2014 | Lo | |
| 9,291,845 B2* | 3/2016 | Shin | G06F 1/1637 |
| 9,594,270 B2 | 3/2017 | Baek et al. | |
| 10,058,989 B2* | 8/2018 | Chellew | B25F 5/00 |
| 2004/0011544 A1 | 1/2004 | Cooper et al. | |
| 2005/0072278 A1* | 4/2005 | Cutler | B25B 23/1425 |
| | | | 81/467 |
| 2007/0086929 A1 | 4/2007 | Kirchhevel et al. | |
| 2008/0168871 A1 | 7/2008 | Gharib et al. | |
| 2009/0316062 A1 | 12/2009 | Nishizawa | |
| 2015/0261033 A1 | 9/2015 | Shin et al. | |
| 2016/0342151 A1 | 11/2016 | Dey, IV et al. | |
| 2018/0345474 A1 | 12/2018 | Brennenstuhl et al. | |
| 2019/0152831 A1* | 5/2019 | An | H05K 1/147 |
| 2019/0271874 A1 | 9/2019 | Fu et al. | |

FOREIGN PATENT DOCUMENTS

| | | |
|---|---|---|
| CN | 103223655 A | 7/2013 |
| CN | 103459096 A | 12/2013 |
| CN | 206100275 U | 4/2017 |
| CN | 206344092 U | 7/2017 |
| CN | 207818099 U | 9/2018 |
| JP | H03261989 | 11/1991 |
| WO | 2005035201 A1 | 4/2005 |
| WO | 2012134469 A1 | 10/2012 |

OTHER PUBLICATIONS

Combined Search and Examination Report for corresponding Application No. GB2118287.8 dated Jun. 15, 2022, 6 pages.
Australian Examination Report No. 1 for corresponding AU Application No. 2021286239, dated Jan. 9, 2023, 4 pages.
Canadian Office Action for corresponding CA Application No. 3,143,791, dated Jan. 27, 2023, 3 pages.
Canadian Office Action for corresponding CA Application No. 3,143,791, dated Dec. 15, 2023, 4 pages.
Chinese Office Action for corresponding CN Application No. 202210006843.7, dated Jan. 11, 2024, 11 pages.
Chinese Patent Office, Office Action issued in corresponding Application No. 202210006843.7, dated Oct. 30, 2024, 7 pp.

* cited by examiner

FRAME FOR DISPLAY ASSEMBLY

TECHNICAL FIELD OF THE INVENTION

The present invention relates generally to a frame for a display assembly of a tool.

BACKGROUND OF THE INVENTION

Display assemblies, such as, for example, LCD and LED displays, can be used in hand tools to display information to a user. Such hand tools can include, for example, motorized ratchet wrenches and drivers and commonly used in automotive, industrial, and household applications to tighten and untighten work pieces, such as threaded fasteners, and to apply a torque and/or angular displacement to a work piece. Hand tools, such as power ratchets and drivers, generally include a motor contained in a housing, along with other components such as switches, printed circuit boards (PCBs), and a power source (e.g., battery), for example. Accordingly, housings of the hand tools require space to accommodate all the components needed to operate these tools, especially for hand tools that use brushless DC electric motors.

Adding the additional electronics that brushless DC electric motors require can be difficult because of space constraints, especially when a display and corresponding display control buttons are also necessary. Display assemblies utilize protective frames to protect components of the displays. Typically, display assemblies require fasteners to retain protective frames to the display housings. The tool thus must include space to accommodate the fasteners.

SUMMARY OF THE INVENTION

The present invention relates broadly to a display assembly with a housing, a frame, one or more buttons, and a display unit, such as an LCD or LED. The housing, frame, buttons, and display unit are shaped to correspond with external geometry of the tool housing, such as, for example, arcuate or cylindrically shaped. The housing includes one or more protrusions adapted to engage the frame to retain the frame to the housing. By using protrusions for retaining the frame to the housing, fasteners are eliminated and space for the fasteners in the tool housing are no longer needed.

In an embodiment, the present invention broadly comprises a tool having a tool housing portion and a display assembly disposed in the tool housing portion. The display assembly includes a display housing having a protrusion, a frame having an aperture adapted to receive the protrusion to couple the frame to the display housing, and a display unit disposed between the display housing and the frame.

In another embodiment, the present invention broadly comprises a display assembly. The display assembly includes a display housing having a protrusion, a frame having an aperture adapted to receive the protrusion to couple the frame to the display housing, and a display unit disposed between the display housing and the frame.

In another embodiment, the present invention broadly comprises a frame of a display assembly. The frame includes an aperture adapted to receive a protrusion of a display housing to couple the frame to the display housing, a display driver opening, and a ribbon cable holder.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its construction and operation, and many of its advantages should be readily understood and appreciated.

DETAILED DESCRIPTION OF THE INVENTION

Figure 1:
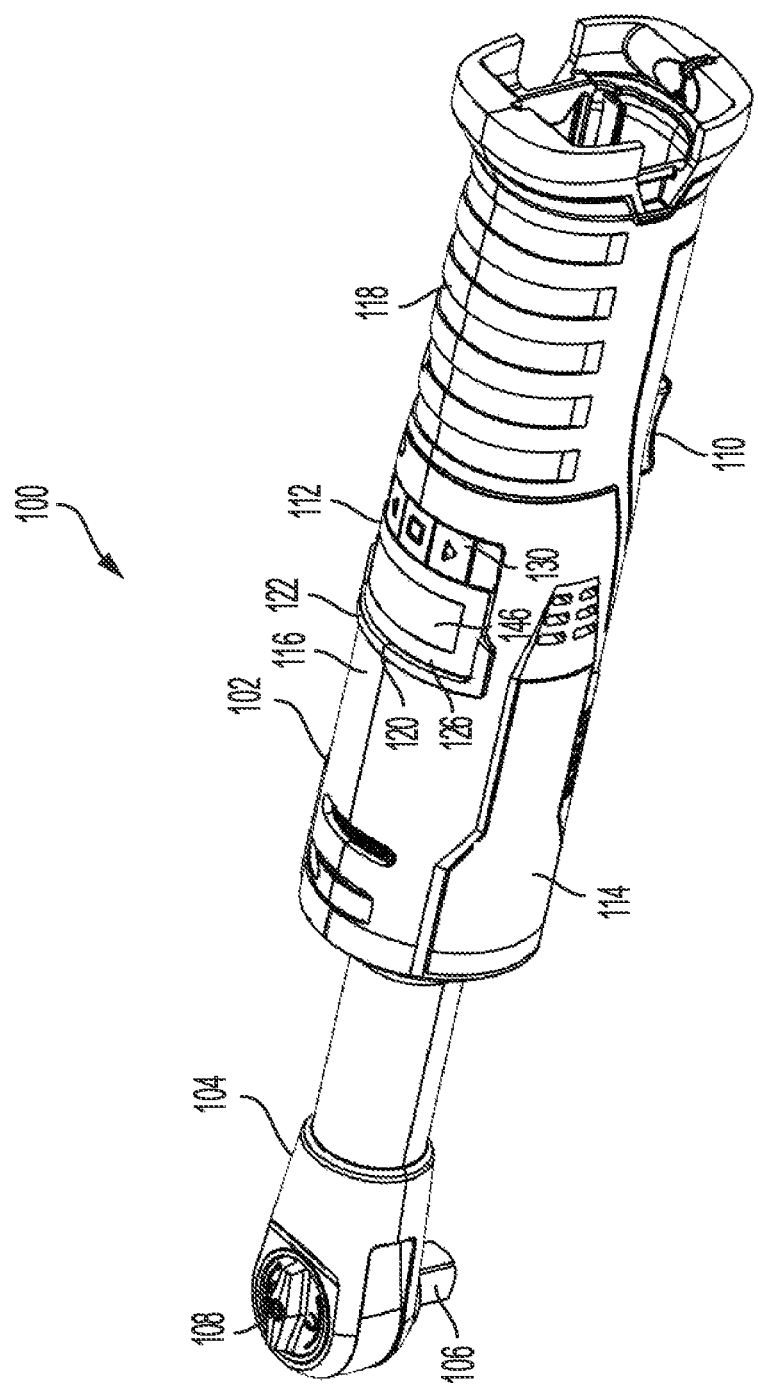
FIG. 1 is a perspective view of an exemplary tool, such as a motorized ratchet tool, including a display assembly in accordance with an embodiment of the present invention.
Figure 2:
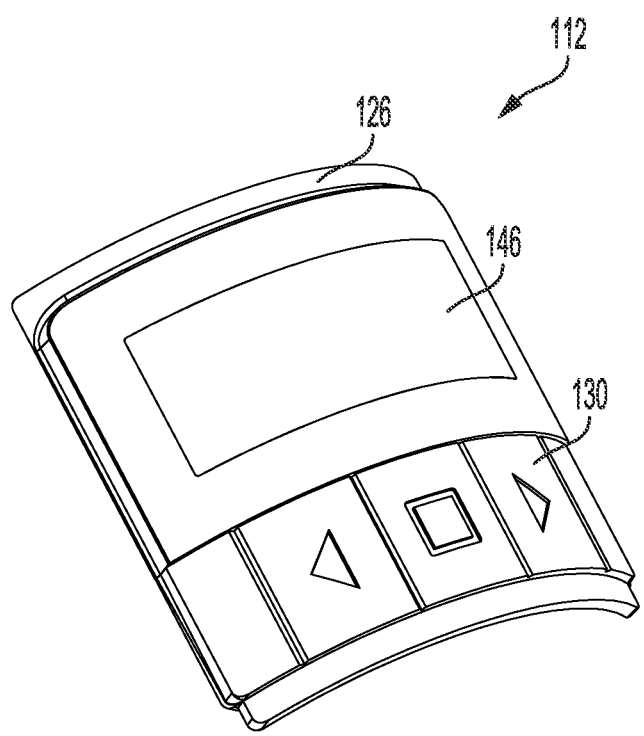
FIG. 2 is a perspective view of an exemplar display assembly, according to an embodiment of the present invention.
Figure 3:
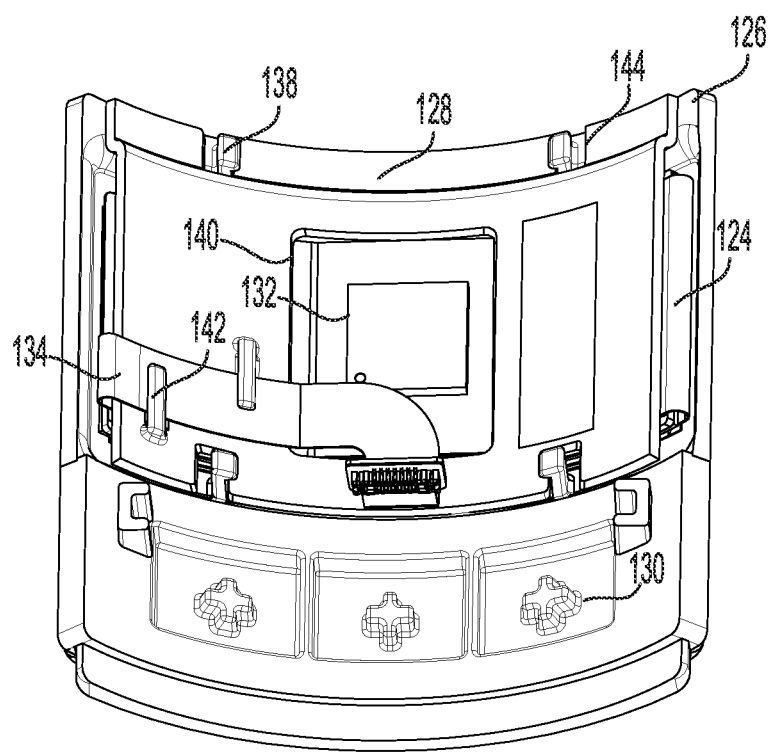
FIG. 3 is a rear view of the display assembly of FIG. 2.
Figure 4:
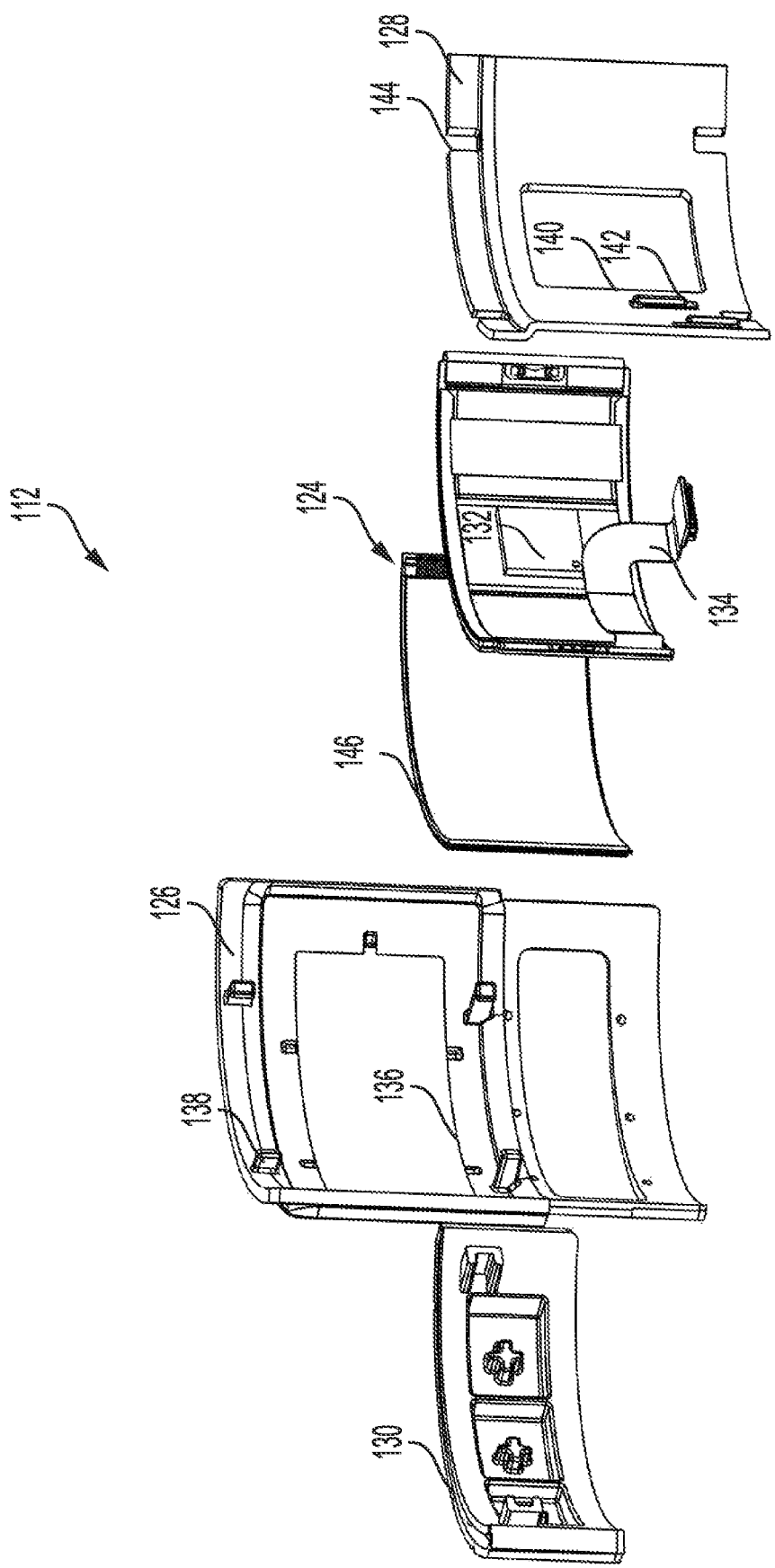
FIG. 4 is an exploded, disassembled perspective view of the display assembly of FIG. 2.
Figure 5:
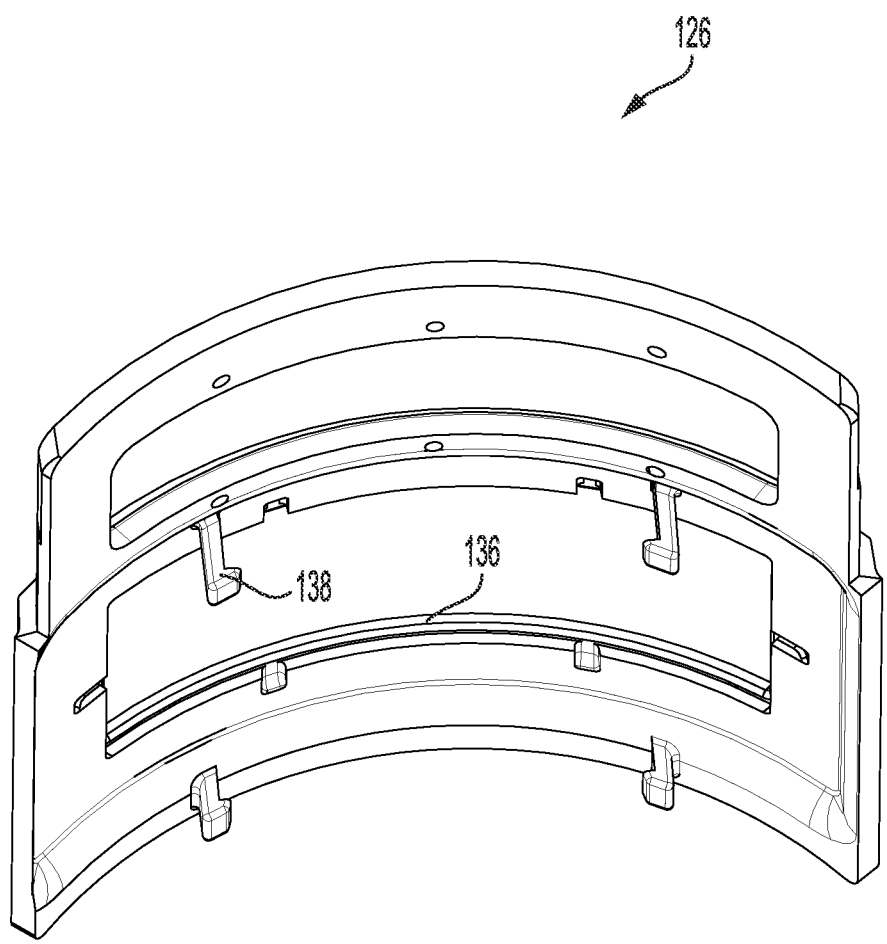
FIG. 5 is a perspective side view of a display housing of the display assembly, in accordance with an embodiment of the present invention.
Figure 6:
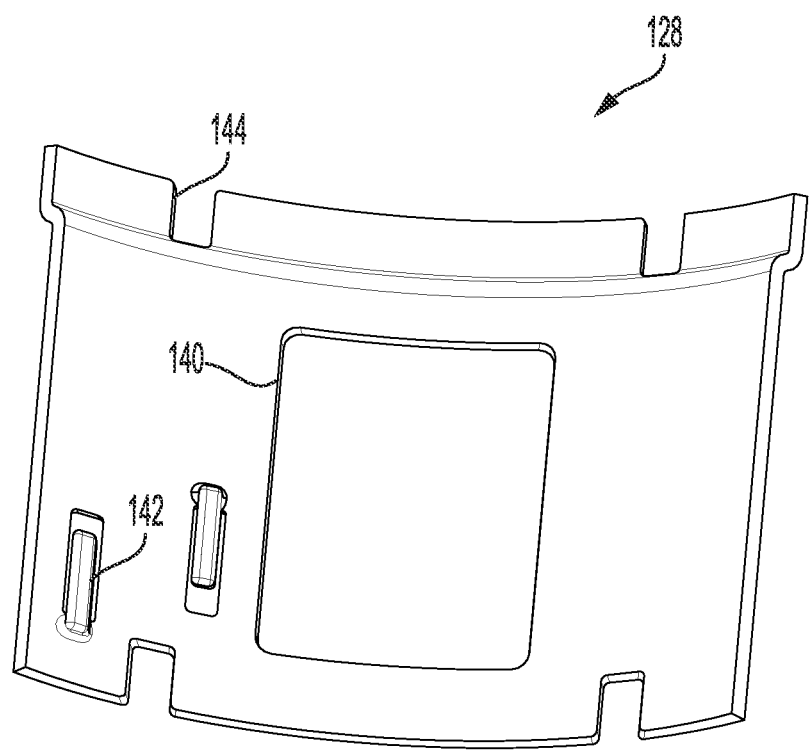
FIG. 6 is a rear view of an exemplar frame of the display assembly, in accordance with an embodiment of the present invention.

While the present invention is susceptible of embodiments in many different forms, there is shown in the drawings, and will herein be described in detail, embodiments of the invention, including a preferred embodiment, with the understanding that the present disclosure is to be considered as an exemplification of the principles of the present invention and is not intended to limit the broad aspect of the invention to any one or more embodiments illustrated herein. As used herein, the term "present invention" is not intended to limit the scope of the claimed invention, but is instead used to discuss exemplary embodiments of the invention for explanatory purposes only.

The present invention broadly comprises a display assembly. In an embodiment, the display assembly is disposed in a motorized hand tool, such as, for example, a motorized ratchet tool. The display assembly includes a housing, a frame, one or more buttons, and a display unit, such as an LCD or LED. In an embodiment, the housing, frame, buttons, and display unit are arcuate or cylindrically shaped to correspond with external geometry of the tool housing. The housing includes one or more protrusions adapted to engage the frame to couple the frame to the housing. By using protrusions for coupling the frame to the housing, fasteners are eliminated, thereby requiring less space compared to current solutions.

Referring to FIGS. 1-6, a tool 100, such as, for example, a motorized ratchet tool, includes a tool housing portion 102 and a driver portion 104 coupled to the tool housing portion 102. The driver portion 104 is adapted to apply torque to a work piece and may include a drive lug 106 adapted to engage a tool (e.g., socket or bit) to drive the work piece, for example, in a well-known manner. The drive lug 106 is operatively coupled to and driven by a motor (not shown) via a ratcheting mechanism (not shown) of the driver portion 104 in a well-known manner. The driver portion 104 also includes a selector knob 108 adapted to select a rotational drive direction of the drive lug 106 (i.e., clockwise or counter-clockwise). In an embodiment, the driver portion 104 is a ratchet head of a ratchet tool.

The tool housing portion 102 operably houses one or more of the motor adapted to drive the drive lug 106, a trigger 110 adapted to actuate the motor, a power source (not shown) adapted to provide electrical power for the motor, such as, for example, a battery, one or more PCBs for motor and/or display control, and a display assembly 112 (described in more detail below). In an embodiment, the housing portion 102 is assembled from first and second clamshell housing portions 114, 116 coupled together to cooperatively form the tool housing portion 102. The housing portion 102 may also include a handle portion 118 that a user may grip or hold during operation of the tool 100.

The first and second clamshell housing portions 114, 116 are configured to couple together and couple the driver assembly 104 to the tool 100. When assembled, as shown in FIG. 1, for example, the first and second clamshell housing portions 114, 116 retain the display assembly 112 therein. In an embodiment, the first and second clamshell housing portions 114, 116 cooperatively form a display opening or window 120 when coupled together. The display opening 120 includes a peripheral lip 122 disposed at least partially around the perimeter of the display opening 120 to retain the display assembly 112 in the first and second clamshell housing portions 114, 116.

The motor can be, for example, an electric motor operably coupled to the power source via the trigger 110. The power source can be external (e.g., an electrical wall outlet, generator, external battery, etc.) or internal (e.g., a removable and rechargeable battery). The trigger 110 can be adapted to cause the motor to be turned ON and OFF, or cause electric power/voltage to flow from the power source to the motor or cease flow from the power source to the motor.

The trigger 110 can be an actuation mechanism that employs a push button actuator or other type of actuator. For example, the user can depress the trigger 110 inwardly to selectively cause power to be drawn from the power source to cause the motor to rotate and provide torque to the driver assembly 104 in a desired rotational direction. Any suitable trigger 110 or switch can be implemented without departing from the spirit and scope of the present invention. For example, the trigger 110 can be a toggle actuator, a touch sensitive actuator, a slide actuator, or other suitable actuator or device. In another example, the trigger 110 can be biased such that the trigger 110 is depressible inwardly, relative to the tool housing portion 102, to cause the tool 100 to operate, and releasing the trigger 110 causes the trigger 110 to bias outwardly, relative to the tool housing portion 102, to cease operation of the tool 100 via the biased nature of the trigger 110. The trigger 110 may also be a variable speed type mechanism. In this regard, relative actuation or depression of the trigger 110 causes the motor to operate at variable speeds, depending on the depression level of the trigger 110.

The display assembly 112 includes a display unit 124, a display housing 126, a frame 128, and one or more buttons 130. The display assembly 112 has a shape that substantially corresponds to an external geometry of the tool housing portion 102. For example, each of the display unit 124, display housing 126, frame 128, and one or more buttons 130 is curved, arcuate, or cylindrically shaped.

The display unit 124 is disposed between the display housing 126 and the frame 128. The display unit 124 is adapted to indicate tool information to the user. In an embodiment, the display unit 124 includes a LCD or LED. The tool information can include, for example, a tool status, such as, for example, a power level of the power source, a selected driving direction of the drive lug 106, a power state of the motor, output torque of the tool 100, etc. The display unit 124 can further include a display driver 132 adapted to generate signals with suitable voltage, current, timing and demultiplexing to cause the display unit 124 to show the desired text or image. The display unit 124 further includes a ribbon cable 134 adapted to electrically couple the display unit 124 to a PCB, and a lens 146 adapted to protect the display unit 124. The display unit 124 and/or the lens 146 may include one or more components or layers. For example, display unit 124 and/or the lens 146 may include light guide(s), substrate(s), polarizer(s), diffuser(s), reflector (s), and other such components or layers.

The display housing 126 includes a display opening 136 adapted to allow the display unit 124 to be viewed by a user. In an embodiment, the display opening 136 is adapted to receive the lens 146. The display housing 126 further includes one or more protrusions 138 extending from the display housing 126 and adapted to engage the frame 128 to couple the frame 128 and the display unit 124 together. In an embodiment, the protrusions 138 are hooks. The length of the protrusions 138 are sized to properly hold the frame 128 to apply a compressive force to the display unit 124 between the frame 128 and display housing 126. Although four protrusions 138 are illustrated, any number of protrusions 138 can be used to retain the frame 128 and the display unit 124 to the display housing 126.

The frame 128 is adapted to provide protection to the display unit 124 by serving as a structural "backbone" of the display assembly 112. In an embodiment, the frame 128 includes a display driver opening 140. The display driver opening 140 allows for improved cooling of the display driver 132, thereby lessening a chance of damage to the display driver 132 due to overheating. In an embodiment, the frame 128 further includes one or more ribbon cable holders 142 adapted to retain the ribbon cable 134 to the frame 128. Although two ribbon cable holders 142 are illustrated, the invention is not limited as such and any suitable number of cable holders can be used. The frame 128 further includes apertures 144 adapted to receive and engage the protrusions 138 of the display housing 126 to be retained thereto. Although four apertures 144 are illustrated, the invention is not limited as such and any suitable number of apertures corresponding to the number of protrusions 138 can be used. In an embodiment, the frame 128 is constructed of a plastic material.

The one or more buttons 130 are also disposed on the display housing 126. The buttons 130 are coupled to the display unit 124 in a well-known manner and are adapted to receive a user input, such as, for example, selecting what is to be shown on the display unit 124, for selecting tool parameters, such as, for example, the driving direction of the drive lug 106, and/or for otherwise manipulating the display unit 124 to control the tool 100 and/or parameters of the tool 100. The buttons 128 can be made of an elastomer material, such as, for example, rubber.

As discussed above, the aspects of the present invention are described in terms of a motorized ratchet tool, as shown. However, it should be understood that aspects of the present invention could be implanted in other hand tools or implements. For example, and without limitation, the hand tool can be ratchet wrench, open wrench, screw driver, nut driver, drill, or any other tool capable of applying torque to a work piece.

As used herein, the term "coupled" can mean any physical, electrical, magnetic, or other connection, either direct or indirect, between two parties. The term "coupled" is not limited to a fixed direct coupling between two entities.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of the inventors' contribution. The actual scope of the protection sought is intended to be defined in the following claims when viewed in their proper perspective based on the prior art.

What is claimed is:

1. A tool comprising:
a tool housing portion; and
a display assembly coupled to the tool housing portion, the display assembly including:
 a frame having an aperture;
 a display housing having a protrusion adapted to extend through the aperture and engage the frame; and
 a display unit disposed between the display housing and the frame, wherein engagement of the protrusion with the frame is adapted to apply a compressive force to cause the display unit to be retained between the display housing and the frame.

2. The tool of claim 1, wherein the tool is a motorized ratchet tool.

3. The tool of claim 1, wherein the tool housing portion is a clamshell housing having first and second clamshell housing portions coupled together.

4. The tool of claim 1, wherein each of the display unit, the display housing, and the frame has a shape that substantially corresponds to external geometry of the housing portion.

5. The tool of claim 1, wherein each of the display unit, the display housing, and the frame has a curved shape.

6. The tool of claim 1, wherein the display unit is either one of a LCD or LED display.

7. The tool of claim 1, wherein the display unit includes a display driver, a ribbon cable, and a lens.

8. The tool of claim 7, wherein the frame includes a display driver opening.

9. The tool of claim 7, wherein the frame includes a ribbon cable holder.

10. The tool of claim 1, wherein the protrusion is a hook.

11. A display assembly for a tool, comprising:
a frame having an aperture;
a display housing having a protrusion adapted to extend through the aperture and engage the frame; and
a display unit disposed between the display housing and the frame, wherein engagement of the protrusion with the frame is adapted to apply a compressive force to cause the display unit to be retained between the display housing and the frame.

12. The display assembly of claim 11, wherein each of the display unit, the display housing, and the frame has a curved shape.

13. The display assembly of claim 11, wherein the display unit is either one of a LCD or LED display.

14. The display assembly of claim 11, wherein the display unit includes a display driver and a ribbon cable.

15. The display assembly of claim 14, wherein the frame includes a display driver opening and a ribbon cable holder.

16. The display assembly of claim 11, wherein the protrusion is a hook.

17. The display assembly of claim 11, wherein the frame and the display housing apply a compressive force to the display unit when coupled together.

18. The display assembly of claim 11, further comprising a button coupled to the display housing.

* * * * *